US009443701B2

(12) United States Patent
Watanabe

(10) Patent No.: US 9,443,701 B2
(45) Date of Patent: Sep. 13, 2016

(54) ETCHING METHOD

(71) Applicant: TOKYO ELECTRON LIMITED, Tokyo (JP)

(72) Inventor: Hikaru Watanabe, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/705,462

(22) Filed: May 6, 2015

(65) Prior Publication Data

US 2015/0325415 A1    Nov. 12, 2015

(30) Foreign Application Priority Data

May 9, 2014   (JP) ................. 2014-097710

(51) Int. Cl.
H01J 37/32         (2006.01)
H01L 21/311        (2006.01)
H01L 21/768        (2006.01)

(52) U.S. Cl.
CPC ...... *H01J 37/32532* (2013.01); *H01J 37/3244* (2013.01); *H01L 21/31116* (2013.01); *H01L 21/76897* (2013.01); *H01J 2237/334* (2013.01)

(58) Field of Classification Search
None
See application file for complete search history.

(56) References Cited

U.S. PATENT DOCUMENTS

| 5,328,558 A * | 7/1994 | Kawamura | H01L 21/31116 148/DIG. 17 |
| 5,919,336 A * | 7/1999 | Kikuchi | H01J 37/32357 134/1.1 |
| 6,376,386 B1 * | 4/2002 | Oshima | H01L 21/31116 257/E21.252 |
| 6,706,334 B1 * | 3/2004 | Kobayashi | H01J 37/32082 134/1.1 |
| 7,416,989 B1 * | 8/2008 | Liu | H01L 21/02063 438/706 |
| 8,058,179 B1 * | 11/2011 | Draeger | H01L 21/02164 156/345.26 |
| 8,398,813 B2 * | 3/2013 | Kobayashi | H01J 37/32192 156/345.31 |
| 2001/0015261 A1 | 8/2001 | Kobayashi et al. | |
| 2006/0066247 A1 * | 3/2006 | Koshiishi | H01J 37/32018 315/111.21 |
| 2008/0233757 A1 * | 9/2008 | Honda | H01J 37/32091 438/711 |
| 2010/0213162 A1 * | 8/2010 | Mochiki | H01J 37/32027 216/17 |
| 2015/0235860 A1 * | 8/2015 | Tomura | H01L 21/311 438/694 |
| 2015/0255305 A1 * | 9/2015 | Nakagawa | H01J 37/32027 438/714 |

FOREIGN PATENT DOCUMENTS

| EP | 0 658 928 A1 | 6/1995 |
| JP | 2007-515074 A | 6/2007 |
| JP | 2013-503482 A | 1/2013 |

* cited by examiner

*Primary Examiner* — Anita Alanko
(74) *Attorney, Agent, or Firm* — Rohtwell, Figg, Ernst & Manbeck, P.C.

(57) ABSTRACT

Disclosed is an etching method for selectively etching an oxidation layer made of silicon from a processing target object having the oxidation layer within a processing chamber of a plasma processing apparatus. The etching method includes: forming an altered layer by generating plasma of a gas containing hydrogen, nitrogen, and fluorine to alter the oxidation layer; and after the forming the altered layer, irradiating secondary electrons to the processing target object to remove the altered layer within the processing chamber, in which a negative direct current voltage is applied on an upper electrode of the plasma processing apparatus so that positive ions generated from plasma collide against the upper electrode and thus the secondary electrons are emitted from the upper electrode.

13 Claims, 10 Drawing Sheets

ETCHING METHOD

CROSS-REFERENCE TO RELATED APPLICATIONS

This application is based on and claims priority from Japanese Patent Application No. 2014-097710, filed on May 9, 2014, with the Japan Patent Office, the disclosures of which are incorporated herein in their entireties by reference.

TECHNICAL FIELD

An exemplary embodiment of the present disclosure relates to an etching method.

BACKGROUND

In manufacturing a semiconductor device, a processing for removing a partial region of a processing target object may be performed. For example, a method for removing a silicon oxide film from a processing target object is disclosed in Japanese National Phase Patent Laid-Open Publication No. 2007-515074.

In the method disclosed in Japanese National Phase Patent Laid-Open Publication No. 2007-515074, HF and $NH_3$ react with silicon oxide in a chemical processing chamber to generate $(NH_4)_2SiF_6$. That is, a surface of the silicon oxide film is altered by the reaction. Subsequently, the processing target object is carried into a thermal processing chamber different from the chemical processing chamber, and the processing target object is heated in the chemical processing chamber so as to thermally decompose the $(NH_4)_2SiF_6$ in the altered layer. In the processing disclosed in Japanese Patent Laid-Open Publication No. 2007-515074, the silicon oxide film is selectively removed by the alteration and thermal decomposition. Further, Japanese National Phase Patent Laid-Open Publication No. 2013-503482 discloses a process of altering a carbon-containing film by plasma of a gas containing $NH_3$ and $NF_3$, and removing the altered layer by the thermal decomposition.

SUMMARY

In an aspect, there is provided an etching method for selectively etching an oxidation layer made of silicon from a processing target object having the oxidation layer within a processing chamber of a plasma processing apparatus. The etching method includes: (a) forming an altered layer by generating plasma of a gas containing hydrogen, nitrogen, and fluorine to alter the oxidation layer (hereinafter, referred to as "step (a)"; and (b) after the forming the altered layer, irradiating secondary electrons to the processing target object to remove the altered layer within the processing chamber, in which a negative direct current voltage is applied on an upper electrode of the plasma processing apparatus so that positive ions generated from plasma collide against the upper electrode and thus the secondary electrons are emitted from the upper electrode (hereinafter, referred to as "step (b)." In step (a) of an exemplary embodiment, plasma of a gas containing $H_2$, $N_2$, and $NF_3$ or plasma of a gas containing $NH_3$ and $NF_3$ is generated. In step (b) of an exemplary embodiment, plasma of an inert gas is generated within the processing chamber. Further, in an exemplary embodiment, steps (a) and (b) may be repeated multiple times.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
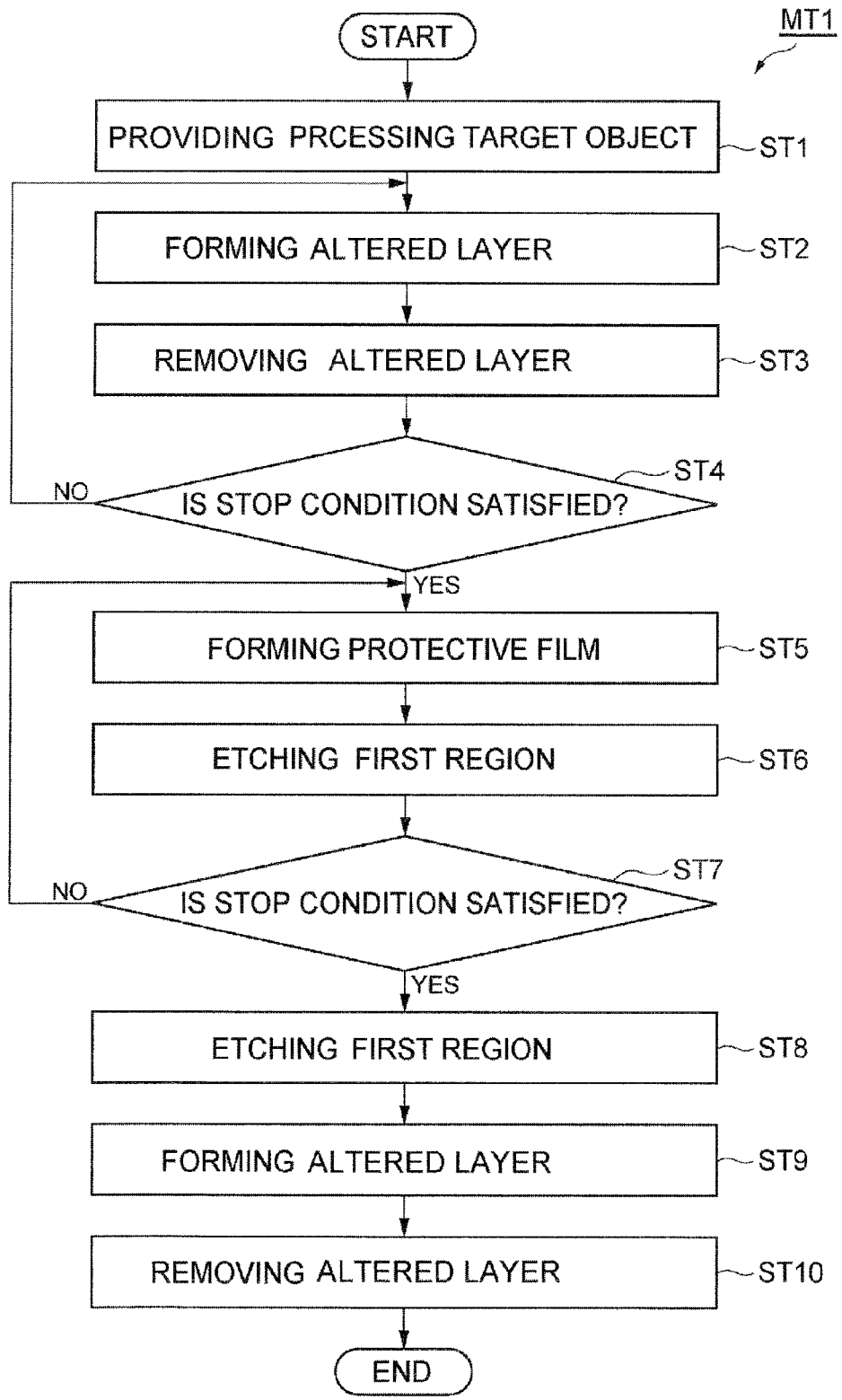
FIG. 1 is a flow chart illustrating an etching method according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the method disclosed in Japanese National Phase Patent Laid-Open Publication No. 2007-515074, after the surface of the silicon oxide film is altered, it is necessary to convey the processing target object from the chemical processing chamber to the heat treatment chamber in order to remove an altered layer by a heat treatment. Thus, in the method disclosed in Japanese National Phase Patent Laid-Open Publication No. 2007-515074, a processing throughput of the processing target object is degraded by the amount of conveying the processing target object, as a result, the productivity thereof is degraded.

Therefore, what is requested in the relevant technical field is an etching method capable of selectively etching a region made of silicon oxide without degrading the processing throughput.

In an aspect, there is provided an etching method for selectively etching an oxidation layer made of silicon from a processing target object having the oxidation layer within a processing chamber of a plasma processing apparatus. The etching method includes: (a) forming an altered layer by generating plasma of a gas containing hydrogen, nitrogen, and fluorine to alter the oxidation layer (hereinafter, referred to as "step (a)"; and (b) after the forming the altered layer, irradiating secondary electrons to the processing target object to remove the altered layer within the processing chamber, in which a negative direct current voltage is applied on an upper electrode of the plasma processing apparatus so that positive ions generated from plasma collide against the upper electrode and thus the secondary electrons are emitted from the upper electrode (hereinafter, referred to as "step (b)." In step (a) of an exemplary embodiment, plasma of a gas containing $H_2$, $N_2$, and $NF_3$ or plasma of a gas containing $NH_3$ and $NF_3$ is generated. In step (b) of an exemplary embodiment, plasma of an inert gas is generated within the processing chamber. Further, in an exemplary embodiment, steps (a) and (b) may be repeated multiple times.

In the method described above, an altered layer is generated by a gas containing hydrogen, nitrogen, and fluorine. Subsequently, in step (b), secondary electrons are irradiated to the processing target object. In step (b), the altered layer of the processing target object sublimates by the kinetic energy of the secondary electrons, and the altered layer is selectively removed. In this method, since steps (a) and (b) may be performed within the same processing chamber, it is not necessary to carry the processing target object into a processing chamber that is different from a thermal processing chamber. Accordingly, the region made of silicon oxide can be selectively etched without degrading the throughput. Further, since the secondary electrons having a high linearity are irradiated to the processing target object, the oxidation layer can be removed from the processing target object with a high anisotropy.

In an exemplary embodiment, the processing target object further includes a nitration layer made of silicon nitride, and the method further includes, after the process (b), (c) forming a protective film on the nitration layer which is thicker than a protective film formed on the oxidation layer, the processing target object being exposed to a plasma of a fluorocarbon gas (hereinafter, referred to be a "process (c)"); and (d) etching the oxidation layer, the processing target object being exposed to the plasma of the fluorocarbon gas (hereinafter, referred to be a "process (d)"), a high frequency power supplied to a placing table configured to place the processing target object thereon in the process (c) is smaller than a high frequency bias power supplied to the placing table in the process (d), and a temperature of the processing target object may be set to be equal to or larger than 60° C. and equal to or smaller than 250° C. in the process (c). In an exemplary embodiment, the processing target object further includes a nitration layer made of silicon nitride. After the removing the altered layer, the etching method further comprises: (c) forming a protective film on the nitration layer which is thicker than a protective film formed on the oxidation layer, in which the processing target object is exposed to plasma of a fluorocarbon gas (hereinafter, referred to as "step (c)"; and (d) etching the oxidation layer, in which the processing target object is exposed to the plasma of the fluorocarbon gas (hereinafter, referred to as "step (d)". A high frequency power supplied to a placing table configured to place the processing target object thereon in step (c) is lower than a high frequency bias power supplied to the placing table in step (d). In step (c), the temperature of the processing target object may be set to be equal to or higher than 60° C. and equal to or lower than 250° C. In an exemplary embodiment, in step (c), a high frequency bias power may not be supplied to the placing table.

In the temperature environment that is equal to or higher than 60° C. and equal to or lower than 250° C., the thickness of the protective film formed on the nitration layer is thicker than that of the protective film formed on the oxidation layer. Further, the etching rate of the nitration layer is low in a state where a relatively low bias power is supplied. Therefore, according to the etching method, a thick protective film may be formed on the nitration layer in step (c), and the etching of the nitration layer may be suppressed when the oxidation layer is selectively etched in step (d).

In an exemplary embodiment, the nitration layer is covered with the oxidation layer, and steps (c) and (d) may be performed after the nitration layer is appeared from the oxidation layer by steps (a) and (b). In this exemplary embodiment, by performing steps (c) and (d) after performing steps (a) and (b), the oxidation layer may be etched while suppressing a damage of the nitration layer even after the nitration layer is appeared from the oxidation layer.

In an exemplary embodiment, in step (c), a gas containing at least one of $C_4F_6$, $C_4F_8$, and $C_6F_6$ may be used as the fluorocarbon gas. Further, in an exemplary embodiment, steps (c) and (d) may be alternately repeated.

In an exemplary embodiment, after step (b), the etching method may further include: (e) exposing the processing target object to plasma of a processing gas including a fluorocarbon gas, in which the oxidation layer is etched and a deposition film including a fluorocarbon is formed on the oxidation layer (hereinafter, referred to as "step (e)"); and (f) etching the oxidation layer by a radical of the fluorocarbon included in the deposition film (hereinafter, referred to as "step (f)"). In the etching method, steps (e) and (f) may be alternately repeated.

In this exemplary embodiment, the oxidation layer is etched by the plasma of the fluorocarbon gas which is generated in step (e), and a deposition film is generated on the etched oxidation layer. Subsequently, in step (f), the oxidation layer is further etched by the radical of the fluorocarbon which is included in the deposition film. Further, the amount of the deposition film decreases in step (f). Thus, the oxidation layer is further etched by performing step (e). By alternately performing steps (e) and (f), the etching of the oxidation layer, that is, the etching of the silicon oxide film can be prevented from being stopped. As a result, the etching of the silicon oxide film may be continuously performed.

In an exemplary embodiment, in the step of etching the oxidation layer by the radical of the fluorocarbon, the processing target object may be exposed to plasma of a rare gas. In this exemplary embodiment, the ions of rare gas atoms collide against the deposition film so that the oxidation layer is etched by the radical of the fluorocarbon which is included in the deposition film. Further, in step (f), the fluorocarbon gas may not be substantially supplied.

In an exemplary embodiment, the processing target object further includes a nitration layer made of silicon nitride and the nitration layer is covered with the oxidation layer. Steps (e) and (f) may be performed after the nitration layer is appeared from the oxidation layer by steps (e) and (f). In the present exemplary embodiment, since steps (e) and (f) are performed after performing the processes (a) and (b), the oxidation layer may be etched while suppressing the damage of the nitration layer even after the nitration layer is appeared from the oxidation layer.

According to the aspect and exemplary embodiments of the present disclosure, a region made of silicon oxide can be selectively etched without degrading throughput.

Hereinafter, various exemplary embodiments will be described in detail with reference to the accompanying drawings. In the following description, same or corresponding elements will be given the same reference numerals.

[First Exemplary Embodiment]

FIG. 1 is a flow chart illustrating an etching method according to a first exemplary embodiment. The method MT1 illustrated in FIG. 1 is a method for selectively etching a first region made of silicon oxide. In an example, the method MT1 may be used for forming a hole in a processing target object illustrated in FIG. 2 in a self-alignment manner.

Figure 2:
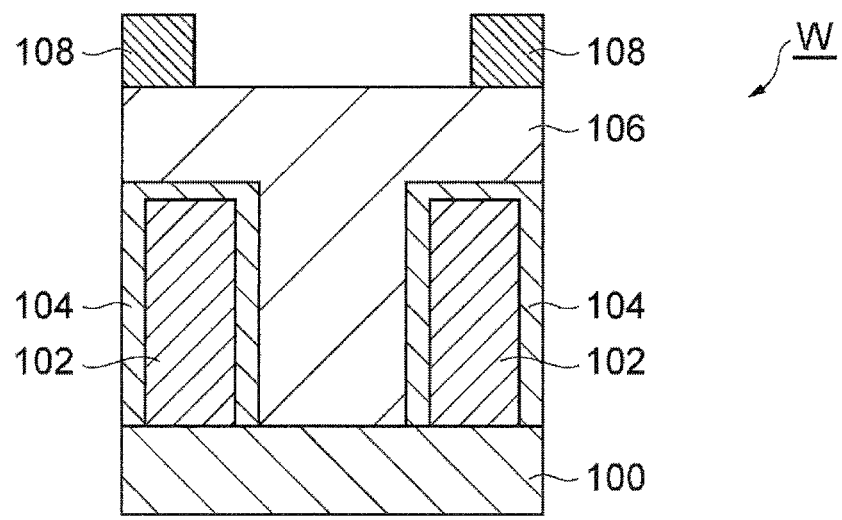
FIG. 2 is a cross sectional view illustrating an exemplary processing target object.

As illustrated in FIG. 1, in the method MT1, step ST1 is first performed. In step ST1, a processing target object W (hereinafter, referred to as a "wafer W") is provided. The provided wafer W is placed on a placing table (PD) which will be described below. An example of the wafer W is illustrated in FIG. 2. The wafer W illustrated in FIG. 2 includes a base layer 100, a plurality of protruding regions 102, a second region 104 (nitration layer), a first region 106 (oxidation layer), and a mask 108. The wafer W may be a product which is obtained during the manufacturing of a fin-type field effect transistor.

The base layer 100 may be made of, for example, polycrystalline silicon. In an example, the base layer 100 is a fin region having a substantially rectangular parallelepiped shape. A plurality of protruding regions 102 is formed on the base layer 100 and arranged substantially in parallel with each other. The protruding regions 102 may be, for example, gate regions. The second region 104 is made of silicon nitride and formed to cover the protruding regions 102. Further, the plurality of protruding regions 102 is covered with the first region 106. That is, the first region 106 is formed to cover the protruding region 102 with the second region 104 being interposed therebetween. The first region 106 is made of silicon oxide. The mask 108 is formed on the first region 106. The mask 108 has a pattern opened upwardly between adjacent protruding regions 102. The mask 108 is made of an organic film. Further, the mask 108 may be formed by a photolithography.

When the method MT1 is performed on the wafer W, the first region 106 of the wafer W may be selectively etched with respect to the second regions 104, and a hole may be formed in a region between the adjacent protruding regions 102 in a self-alignment manner. The formed hole extends to the surface of the base layer 100 through the region between the adjacent protruding regions 102. The hole may be a contact hole which is connected to, for example, a source or a drain of the fin region.

Figure 3:
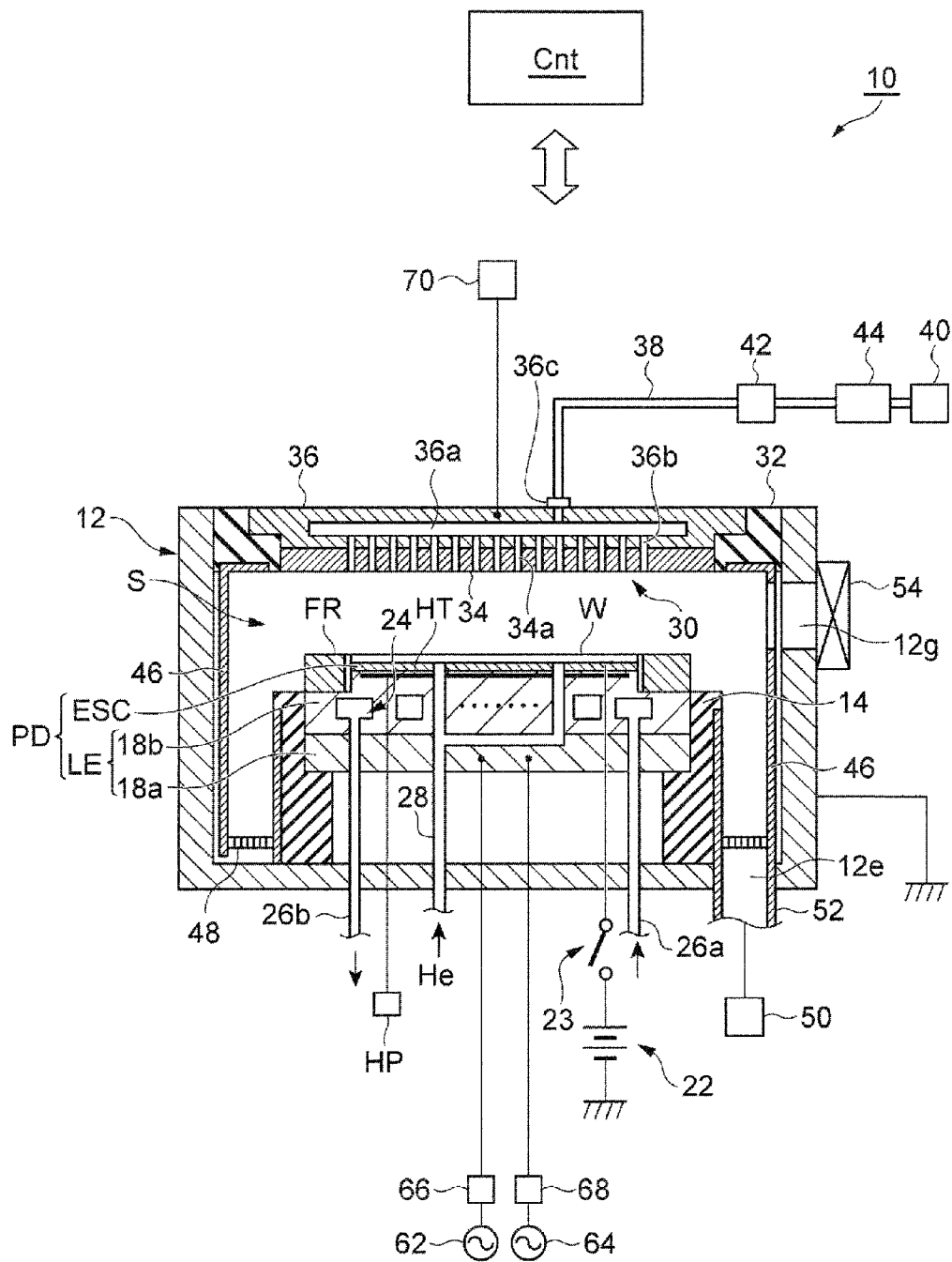
FIG. 3 is a view illustrating a plasma processing apparatus which may be used for performing the etching method according to the first exemplary embodiment.

Hereinafter, a plasma processing apparatus according to an exemplary embodiment which may be used for performing the method MT1 will be described. FIG. 3 is a view illustrating a plasma processing apparatus according to an exemplary embodiment. The plasma processing apparatus 10 illustrated in FIG. 3 is a capacitively coupled plasma etching apparatus, and is provided with a substantially cylindrical processing chamber 12. The inner wall surface of the processing chamber 12 is made of, for example, anodized aluminum. The processing chamber 12 is grounded for safety.

A substantially cylindrical support 14 is provided on a bottom portion of the processing chamber 12. The support 14 is made of, for example, an insulating material. The support 14 extends vertically from the bottom portion of the processing chamber 12 within the processing chamber 12.

Further, a placing table PD is provided in the processing chamber 12. The placing table PD is supported by the support 14.

The placing table PD holds the wafer W on the top surface thereof. The placing table PD is provided with a lower electrode LE and an electrostatic chuck ESC. The lower electrode LE includes a first plate 18a and a second plate 18b. The first plate 18a and the second plate 18b is made of a metal such as, for example, aluminum and have a substantially disk shape. The second plate 18b is provided on the first plate 18a and is electrically connected to the first plate 18a.

The electrostatic chuck ESC is provided on the second plate 18b. The electrostatic chuck ESC has a structure in which an electrode is provided as a conductive film between a pair of insulation layers or insulation sheets. A direct current ("DC") power supply 22 is electrically connected to the electrode of the electrostatic chuck ESC via a switch 23. The electrostatic chuck ESC attracts the wafer W by an electrostatic force such as a Coulomb force generated by a DC voltage from the DC power supply 22. Thus, the electrostatic chuck ESC is able to hold the wafer W.

A focus ring FR is disposed on a peripheral portion of the second plate 18b to surround a peripheral edge of the wafer W and the electrostatic chuck ESC. The focus ring FR is provided so as to improve a uniformity of the etching. The focus ring FR is made of a material properly selected according to a material of an etching target film, and may be made of, for example, quartz.

A coolant flow path 24 is formed within the second plate 18b. The coolant flow path 24 serves as a temperature control mechanism. A coolant is supplied to the coolant flow path 24 from a chiller unit which is provided outside the processing chamber 12 through a pipe 26a. The coolant supplied to the coolant flow path 24 is returned to the chiller unit through a pipe 26b. In this way, the coolant is supplied to the coolant flow path 24 to be circulated. By controlling the temperature of the coolant, the temperature of the wafer W supported by the electrostatic chuck ESC is controlled.

Further, a gas supply line 28 is provided in the plasma processing apparatus 10. The gas supply line 28 supplies a heat transfer gas, for example, He gas, from a heat transfer gas supply mechanism to a gap between the top surface of the electrostatic chuck ESC and the rear surface of the wafer W.

Further, a heater HT serving as a heating element is provided in the plasma processing apparatus 10. The heater HT is covered, for example, with the second plate 18b. A heater power supply HP is connected to the heater HT. A power is supplied to the heater HT from the heater power supply HP to control the temperature of the placing table PD, and thus the temperature of the wafer W placed on the placing table PD is controlled.

Further, the plasma processing apparatus 10 includes an upper electrode 30. The upper electrode 30 is disposed above the placing table PD to face the placing table PD. The lower electrode LE and the upper electrode 30 are provided substantially in parallel to each other. A processing space S configured to perform a plasma processing on the wafer W is provided between the upper electrode 30 and lower electrode LE.

The upper electrode 30 is supported on the top of the processing chamber 12 through an insulating shielding member 32. In an exemplary embodiment, the upper electrode 30 may be configured such that the vertical distance from the top surface of the placing table PD, i.e. the wafer W placing surface is variable. The upper electrode 30 may include an electrode plate 34 and an electrode support 36. The electrode plate 34 faces the processing space S, and a plurality of gas ejecting holes 34a is formed through the electrode plate 34. In an exemplary embodiment, the electrode plate 34 may be made of silicon.

The electrode support 36 is configured to detachably support the electrode plate 34, and may be made of a conductive material such as, for example, aluminum. The electrode support 36 may have a water cooling structure. A gas diffusion chamber 36a is provided within the electrode support 36. A plurality of gas passage holes 36b extends downwardly from the gas diffusion chamber 36a to communicate with the gas ejecting holes 34a. Further, a gas introducing port 36c is formed in the electrode support 36 to introduce a processing gas into the gas diffusion chamber 36a, and a gas supply pipe 38 is connected to the gas introducing port 36c.

A gas source group 40 is connected to the gas supply pipe 38 via a valve group 42 and a flow rate controller group 44. The gas source group 40 includes a plurality of gas sources such as, for example, a first gas, a second gas, a third gas, a fourth gas, an inert gas, and a rare gas. The first gas is a gas containing hydrogen, nitrogen, and fluorine. For example, the first gas may be a mixed gas of $H_2$ gas, $N_2$ gas, and $NF_3$ gas or may be a mixed gas of $NH_3$ gas and $NF_3$ gas. Further, the first gas may further include a rare gas such as, for example, Ar gas. The second and the third gases contain fluorocarbon. Further, the second and third gases contain at least one of $C_4F_6$, $C_4F_8$, and $C_6F_6$. Further, the second to fourth gases may further include a rare gas such as, for example, Ar gas, and $O_2$ gas. The inert gas may be a rare gas such as, for example, Ar gas, or $N_2$ gas. Further, the gas source group 40 may include a gas source of a gas which is different from the above-described gases such as $H_2$ gas and He gas.

The valve group 42 includes a plurality of valves, and the flow rate controller group 44 includes a plurality of flow rate controllers such as, for example, mass flow controllers. The plurality of gas sources of the gas source group 40 is connected to the gas supply pipe 38 via the corresponding valves of the valve group 42 and the corresponding flow rate controllers of the flow rate controller group 44, respectively.

In the plasma processing apparatus 10, a deposition shield 46 is detachably provided along the inner wall of the processing chamber 12. The deposition shield 46 is also provided on the outer periphery of the support 14. The deposition shield 46 is configured to prevent etching by-products (deposits, i.e., deposition film) from being attached on the processing chamber 12, and may be formed by coating a ceramic such as, for example, $Y_2O_3$, on an aluminum material.

At the bottom side of the processing chamber 12, an exhaust plate 48 is provided between the support 14 and the side wall of the processing chamber 12. The exhaust plate 48 may be formed by coating a ceramic such as, for example, $Y_2O_3$, on an aluminum material. An exhaust port 12e is formed below the exhaust plate 48 in the processing chamber 12. An exhaust device 50 is connected to the exhaust port 12e through an exhaust pipe 52. The exhaust device 50 includes a vacuum pump such as, for example, a turbo molecular pump, and may decompress the inside of the processing chamber 12 to a desired vacuum degree. A carry-in/out port 12g of a wafer W is formed on the side wall of the processing chamber 12. The carry-in/out port 12g is configured to be capable of being opened/closed by a gate valve 54.

The plasma processing apparatus 10 further includes a first high frequency power supply 62 and a second high frequency power supply 64. The first high frequency power supply 62 generates a first high frequency power for plasma generation, and generates a high frequency power having a frequency in a range of 27 MHz to 100 MHz, for example, 40 MHz. The first high frequency power supply 62 is connected to the lower electrode LE via a matching unit 66. The matching unit 66 is a circuit that matches an output impedance of the first high frequency power supply 62 with an input impedance of a load side (a lower electrode LE side).

The second high frequency power supply 64 generates a second high frequency power for drawing ions into the wafer W, i.e. a high frequency bias power, and generates a high frequency bias power having a frequency in a range of 400 kHz to 13.56 MHz, for example, a high frequency bias power of 13 MHz. The second high frequency power supply 64 is connected to the lower electrode LE via the matching unit 68. The matching unit 68 is a circuit that matches an output impedance of the second high frequency power supply 64 with an input impedance of a load side (a lower electrode LE side).

The plasma processing apparatus 10 further includes a DC power supply 70. The DC power supply 70 is connected to the upper electrode 30. The DC power supply 70 is capable of generating a negative DC voltage, and applying the DC voltage to the upper electrode 30. When the negative DC voltage is applied to the upper electrode 30, positive ions existing in the processing space S collide against the electrode plate 34. Thus, secondary electrons are emitted from the electrode plate 34.

In an exemplary embodiment, the plasma processing apparatus 10 may further include a control unit Cnt. The control unit Cnt is, for example, a computer provided with a processor, a storage unit, an input device, and a display device, and controls respective components of the plasma processing apparatus 10. Specifically, the control unit Cnt is connected to the valve group 42, the flow rate controller group 44, the exhaust device 50, the first high frequency power supply 62, the matching unit 66, the second high frequency power supply 64, the matching unit 68, the DC power supply 70, the heater power supply HP, and the chiller unit.

The control unit Cnt is operated according to a program based on an input recipe, and transmits a control signal. With the control signal from the control unit Cnt, it is possible to control the selection and flow rate of a gas supplied from the gas source group 40, the exhaust of the exhaust device 50, the power supply from the first high frequency power supply 62 and the second high frequency power supply 64, the supply of the negative DC voltage from the DC power supply 70, the power supply of the heater power supply HP, and the flow rate and temperature of the coolant from the chiller unit.

With reference to FIG. 1 again, each step of the method MT1 will be described in detail together with various controls of the control unit Cnt. In the following description, reference will be made to FIGS. 4A to 7C. FIGS. 4A to 7C are cross-sectional views illustrating a processing target object in a state after performing each step of the etching method according to the first exemplary embodiment.

Figure 4A:
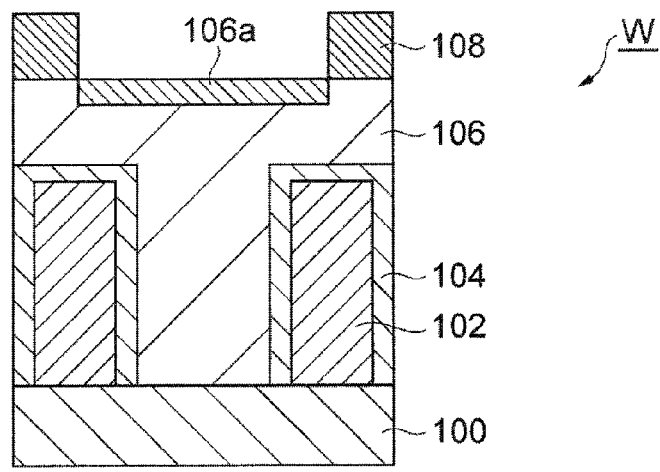
FIGS. 4A and 4B are cross-sectional views illustrating a processing target object in a state where each step of the etching method according to the first exemplary embodiment has been performed.

As illustrated in FIG. 1, step ST2 is subsequently performed in the method MT1. In step ST2, the first region 106 is altered to form an altered layer. Specifically, in step ST2, the wafer W is exposed to the plasma of a gas containing hydrogen, nitrogen, and fluorine. The gas used in step ST2 is the first gas described above, and may be, for example, a mixed gas of H2 gas, N2 gas, and NF3 gas or a mixed gas of NH3 gas and NF3 gas. The first gas may include a rare gas such as, for example, Ar gas. When the wafer W is exposed to the plasma of the first gas, the silicon oxide constituting the first region 106 is altered into ammonium silicofluoride (($NH_4)_2SiF_6$). Thus, as illustrated in FIG. 4A, at least a part of the first region 106 is altered to an altered layer 106*a*.

When step ST2 is performed using the plasma processing apparatus 10, the control unit Cnt controls the valve group 42 and the flow rate controller group 44 such that the first gas is supplied from the gas source group 40. Further, in order to excite the first gas, the control unit Cnt controls the first high frequency power supply 62 to supply the high frequency power to the lower electrode LE.

In step ST2, the pressure within the processing chamber 12 is set to be in a range of 400 mTorr to 600 mTorr (53.33 Pa to 79.99 Pa), for example. Further, the high frequency power supplied from the first high frequency power supply 62 is set to be in a range of 800 W to 1200 W, for example. Further, in step ST2, the high frequency bias power from the second high frequency power supply 64 may not be supplied. Further, when the mixed gas of $H_2$ gas, $N_2$ gas, and $NF_3$ gas is used as the first gas, a partial pressure of the $NF_3$ gas and $H_2$ gas in the first gas is controlled to be in a range of 1:2 to 1:10, for example, 1:2.5. Further, the temperature of the wafer W is controlled to be equal to or smaller than 60° C., for example, 0° C. Thus, the control unit Cnt may control the heater power supply HP of the plasma processing apparatus 10 so as to control the temperature of the placing table PD. Further, the processing time in step ST2 may be set in a range of 30 seconds to 60 seconds.

Subsequently, step ST3 is performed in the method MT1. In step ST3, secondary electrons are irradiated to the wafer W to remove the altered layer 106*a*. When step ST3 is performed in the plasma processing apparatus 10, a processing gas is supplied from the gas source group 40 of the plasma processing apparatus 10. The pressure within the processing chamber 12 is depressurized to a set value by the exhaust device 50. The processing gas used in step ST3 may generate positive ions upon being excited, and may be, for example, a rare gas such as Ar gas or an inert gas such as $N_2$ gas. Further, $H_2$ gas may be used as the processing gas in step ST3. Further, in step ST3, the negative DC voltage is applied to the upper electrode 30 of the plasma processing apparatus 10 from the DC power supply 70. Further, in order to excite the processing gas, the high frequency power from the first high frequency power supply 62 is supplied to the lower electrode LE in step ST3. Thus, plasma having positive ions originating from the processing gas is generated in the processing chamber 12. Further, in step ST3, the high frequency bias power from the second high frequency power supply 64 may be supplied to the lower electrode LE if necessary.

In an example, the pressure within the processing chamber 12 is set to be in a range of 40 mTorr to 60 mTorr (5.33 Pa to 7.99 Pa), for example. The high frequency power supplied from the first high frequency power supply 62 is set to be in a range of 200 W to 400 W, for example. In step ST3, the high frequency bias power from the second high frequency power supply 64 may not be supplied. Further, a negative DC voltage having an absolute value of 1000 V is applied to the upper electrode 30 of the plasma processing apparatus 10 from the DC power supply 70 in step ST3. Further, in step ST3, the negative DC voltage applied to the upper electrode 30 may have at least an absolute value equal to or larger than 500 V, and may be in a range of 800 V to 1200 V, for example. Further, Ar gas is supplied into the processing chamber 12 at a flow rate in a range of 300 sccm to 500 sccm. Further, the temperature of the wafer W is controlled to be equal to or lower than 60° C., for example, 40° C. Further, the processing time in step ST3 may be set to be 20 seconds to 40 seconds.

Figure 4B:
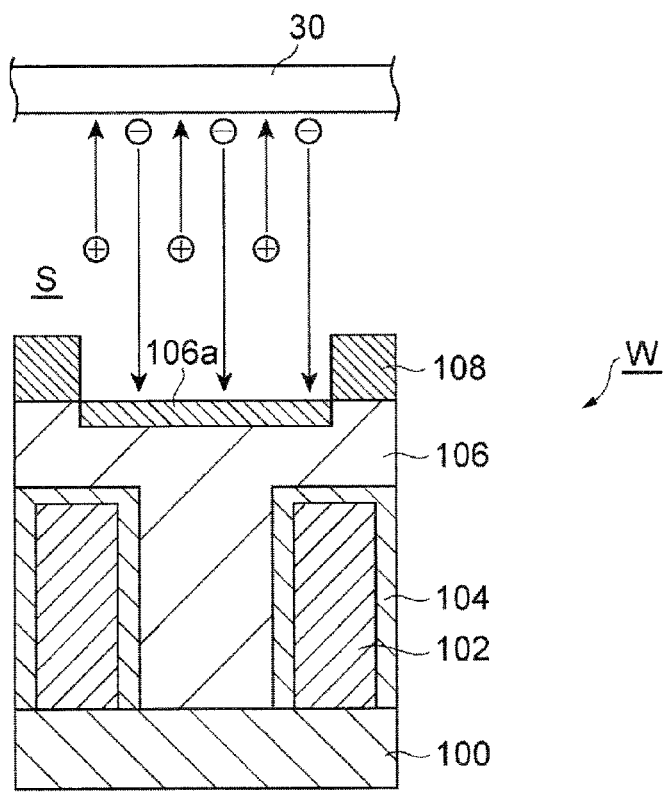
Figure 5A:
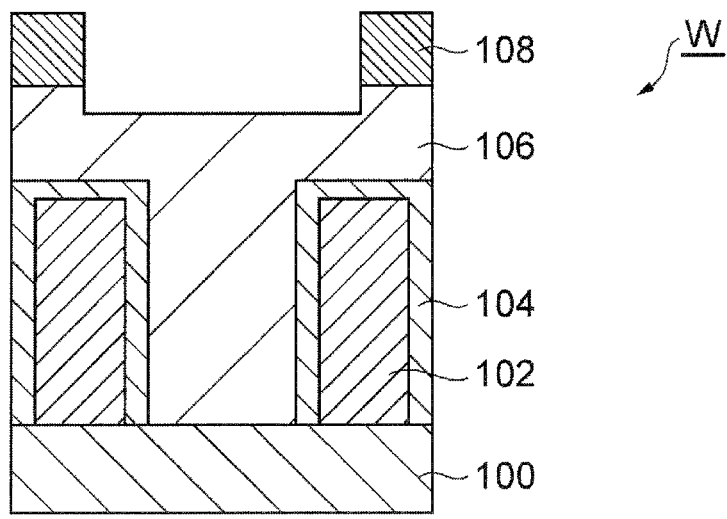
FIGS. 5A and 5B are cross-sectional views illustrating a processing target object in a state where each step of the etching method according to the first exemplary embodiment has been performed.

FIG. 4B is a view for describing a principle of step ST3. In the drawing, a symbol "+" enclosed by a circle represents a positive ion, and a symbol "−" enclosed by a circles represents a secondary electron. When the processing gas is supplied to the processing space S and the high frequency power is supplied to the lower electrode LE from the first high frequency power supply 62, the processing gas is excited, and plasma having positive ions is generated within the processing space S. When the negative DC voltage is applied to the upper electrode 30 in a state where the plasma having positive ions is generated within the processing space S, the positive ions collide against the electrode plate 34 of the upper electrode 30 as illustrated in FIG. 4B. Thus, secondary electrons are emitted from the upper electrode 30, and the secondary electrons are irradiated to the wafer W. When the secondary electrons are irradiated to a surface of the wafer W, the ammonium silicofluoride of the altered layer 106*a* sublimates by the kinetic energy of the secondary electrons. Thus, as illustrated in FIG. 5A, the altered layer 106*a* is removed in step ST3.

Figure 5B:
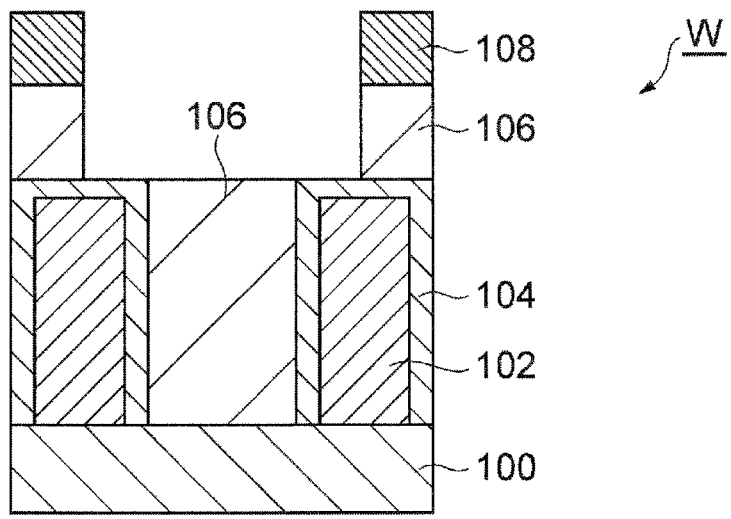

Steps ST2 and ST3 described above are alternately performed a predetermined number of times (e.g., seven times) until the second region 104 is appeared from the first region 106. In step ST4 of the method MT1, it is determined whether a stop condition, that is, a condition that the number of times of performing the processes ST2 and ST3 exceeds the predetermined number of times is satisfied. When the stop condition is not satisfied, steps ST2 and ST3 are repeated. Meanwhile, the stop condition is satisfied, the performing of the processes ST2 and ST3 is terminated. As described above, steps ST2 and ST3 are alternately performed a predetermined number of times so that the first region 106 is partially removed. Thus, the second regions 104 is appeared from the first region 106 as illustrated in FIG. 5B. Further, since steps ST2 and ST3 selectively act on the first region 106, the damage of the second region 104 is suppressed even after the second regions 104 are exposed. Further, in step ST3, since the secondary electrons having a high linearity are irradiated to the wafer W, the etching is suppressed from proceeding in a direction perpendicular to the thickness direction of the first region 106 (i.e., a direction perpendicular to the base layer 100). As a result, the first region 106 may be removed from the wafer W with a high anisotropy. Thus, it is possible to suppress a region existing under the mask 108 in the first region 106 from being removed.

Subsequently, step ST5 is performed in the method MT1. In step ST5, a protective film is formed on the second regions 104 and the first region 106. In step ST5, the formation of the protective film is controlled such that a thickness of the protective film formed on the second regions 104 is thicker than that of the protective film formed on the first region 106.

Specifically, in step ST5, the wafer W is exposed to a plasma of fluorocarbon gas, that is, the second gas containing fluorocarbon, which is described above. In step ST5, a high frequency bias power supplied to the lower electrode LE is controlled to be smaller than that in step ST6 which will be described later. For example, a high frequency bias power is not supplied to the lower electrode LE in step ST5.

Thus, the etching rate of the second regions 104 is decreased so that the second regions 104 are not substantially etched.

Figure 6A:
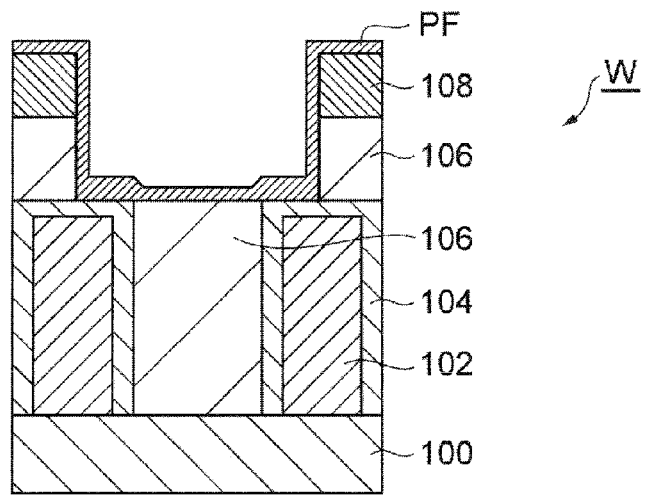
FIGS. 6A to 6C are cross-sectional views illustrating a processing target object in a state where each step of the etching method according to the first exemplary embodiment has been performed.

In step ST5, the temperature of the wafer is set to be equal to or higher than 60° C. and equal to or lower than 250° C. Thus, as illustrated in FIG. 6A, a fluorocarbon-based protective film PF is formed on the second regions 104 and the first region 106, and the thickness of the protective film PF on the second regions 104 is thicker than that on the first region 106. Further, a glass transition temperature exists in the temperature region higher than 250° C., and a difference between the thickness of the protective film PF on the first region 106 and the thickness of the protective film PF on the second region 104 decreases at the glass transition temperature. Further, even at a temperature lower than 60° C., the difference between the thickness of the protective film PF on the first region 106 and the thickness of the protective film PF on the second region 104 decreases.

When step ST5 is performed using the plasma processing apparatus 10, the control unit Cnt controls the valve group 42 and the flow rate controller group 44 such that the second gas is supplied from the gas source group 40. Further, the control unit Cnt controls the first high frequency power supply 62 such that the high frequency power is supplied to the lower electrode LE. Further, the control unit Cnt controls the second high frequency power supply 64 such that the high frequency bias power is a low power, for example, the high frequency bias power is not supplied. Furthermore, the control unit Cnt controls the heater power supply HP of the plasma processing apparatus 10 so as to control the temperature of the placing table PD and as a result the temperature of the wafer W is controlled.

In step ST5, the pressure within the processing chamber 12 is set to be in a range of 10 mTorr to 30 mTorr (1.333 Pa to 4 Pa), for example. Further, in step ST5, a high frequency power of 60 MHz and 500 W to 2000 W is supplied to the lower electrode LE from the first high frequency power supply 62. Further, the flow rates of C4F6 gas, Ar gas, and O2 gas in the second gas are set to be 15 to 25 sccm, 500 to 600 sccm, and 10 to 20 sccm, respectively. Further, the processing time in step ST5 is 10 seconds to 20 seconds.

Subsequently, step ST6 is performed in the method MT1. In step ST6, the first region 106 is etched. In the present example, the first region 106 existing between adjacent protruding regions 102 is etched.

Figure 6B:
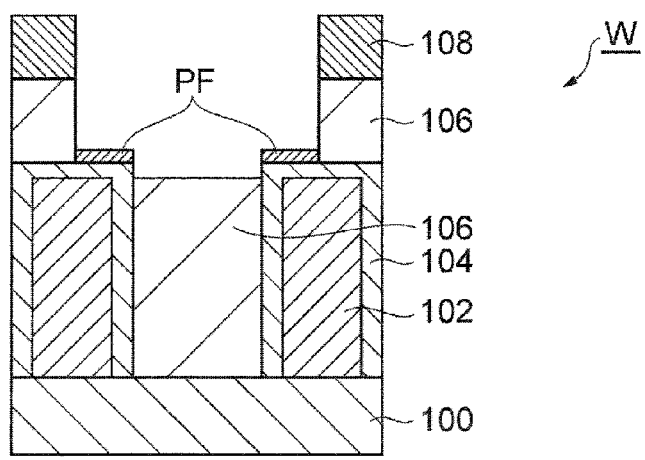

Specifically, in step ST6, the wafer W is exposed to the plasma of fluorocarbon gas, that is, the third gas containing fluorocarbon described above. In step ST6, a high frequency bias power, which is relatively high, is supplied to the lower electrode LE. Thus, the first region 106 formed with a relatively thin protective film PF is etched as illustrated in FIG. 6B.

When step ST6 is performed using the plasma processing apparatus 10, the control unit Cnt controls the valve group 42 and the flow rate controller group 44 such that the third gas is supplied from the gas source group 40. Further, the control unit Cnt controls the first high frequency power supply 62 such that the high frequency power is supplied to the lower electrode LE. Further, the control unit Cnt controls the second high frequency power supply 64 such that the high frequency bias power is supplied to the lower electrode LE.

In step ST6, the pressure within the processing chamber 12 is set to be in a range of 10 mTorr to 30 mTorr (1.333 Pa to 4 Pa), for example. Further, in step ST6, a high frequency power of 60 MHz and 500 W to 2000 W is supplied to the lower electrode LE from the first high frequency power supply 62. Further, in step ST6, a high frequency bias power of 1000 to 2000 W is supplied to the lower electrode LE from the second high frequency power supply 64. Further, the flow rates of $C_4F_6$ gas, Ar gas, and $O_2$ gas in the third gas are set to be 15 to 25 sccm, 500 to 600 sccm and 10 to 20 sccm, respectively. Further, a processing time of step ST6 is 10 to 30 seconds. Further, the temperature of the wafer W in step ST6 may be the same as that in step ST5, or may be lower than that in step ST5.

Figure 6C:
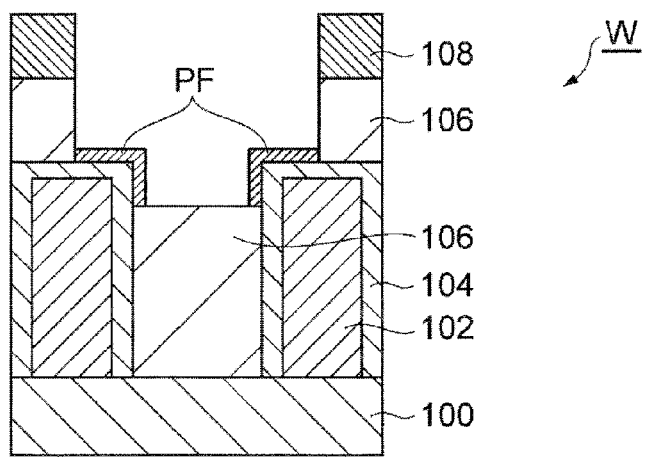

In the method MT1, steps ST5 and ST6 are alternately performed a predetermined number of times. In the method MT1, it is determined whether a stop condition, that is, a condition that the number of times of performing the processes ST5 and ST6 exceeds the predetermined number of times is satisfied. When the stop condition is not satisfied, steps ST5 and ST6 are repeated. Meanwhile, when the stop condition is satisfied, the performing of the processes ST5 and ST6 is terminated. Steps ST5 and ST6 are alternately performed a predetermined number of times as described above, so that the first region 106 existing between adjacent protruding regions 102 is etched to a predetermined depth as illustrated in FIG. 6C. Further, although the etching of the first region 106 does not reach the base layer 100 in FIG. 6C, steps ST5 and ST6 may be performed until the etching of the first region 106 reaches the base layer 100.

By performing steps ST5 and ST6 as described above, it is possible to perform an etching on the first region 106 while suppressing the etching of the second regions 104 where the protective film is not formed immediately after the exposure. When the processes ST5 and ST6 are performed a predetermined number of times, the protective film PF is maintained on the second regions 104. Further, in the etching of a gas containing fluorocarbon, formation of the protective film on the first region 106 and etching of the first region 106 are simultaneously performed. Therefore, after performing steps ST5 and ST6 a predetermined number of times, the first region 106 may be etched by the same etching as step ST6. Thus, it is possible to enhance the etching rate of the first region 106.

Figure 7A:
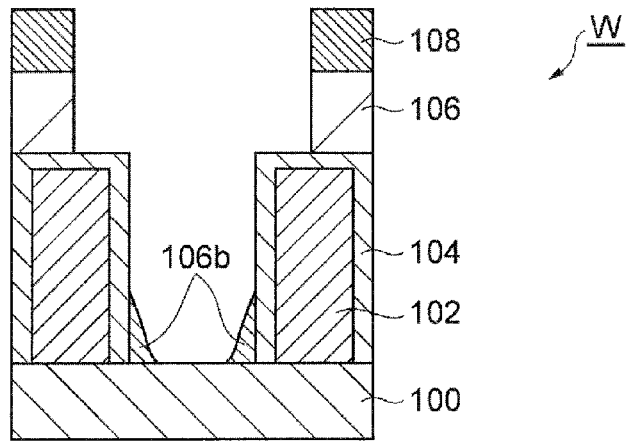
FIGS. 7A to 7C are cross-sectional views illustrating a processing target object in a state where each step of the etching method according to the first exemplary embodiment has been performed.

Specifically, the method MT1 includes step ST8. In step ST8, the etching of the first region 106 existing between adjacent protruding regions 102 is performed at the same condition as step ST6. When step ST8 is performed using the plasma processing apparatus 10, the control unit Cnt may perform the same control as step ST6. When step ST8 is performed, as illustrated in FIG. 7A, a hole reaching the base layer 100 is formed in the wafer W. However, as illustrated in FIG. 7A, a residue 160b (oxidation layer) made of silicon oxide may be left in a corner portion surrounded by the base layer 100 and the second regions 104.

In the method MT1, steps ST9 and ST10 may be further performed in order to remove the residue 160b. Step ST9 is the same as step ST2, and step ST10 is the same as step ST3. Further, when steps ST9 and ST10 are performed using the plasma processing apparatus 10, the control unit Cnt may perform the control which is described in steps ST2 and ST3.

Figure 7B:
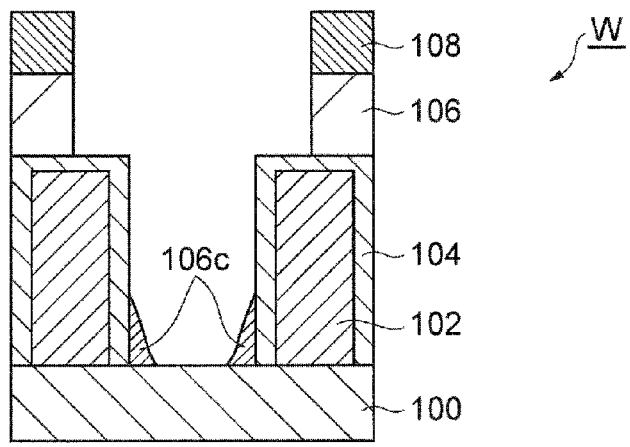
Figure 7C:
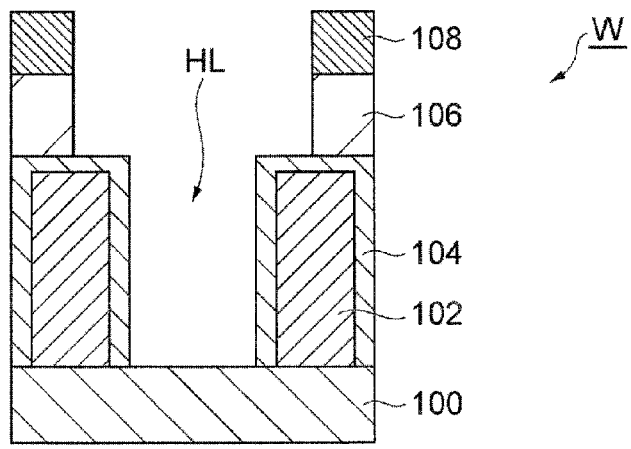

In the method MT1, the residue 106b is altered to form an altered layer 106c by step ST9 as illustrated in FIG. 7B. Further, the altered layer 106c may be removed by step ST10 as illustrated in FIG. 7C. Steps ST9 and ST10 may be alternately repeated multiple times. Accordingly, according to the method MT1, the hole HL can be formed in a self-alignment manner between the adjacent protruding regions 102.

(Second Exemplary Embodiment)

Figure 8:
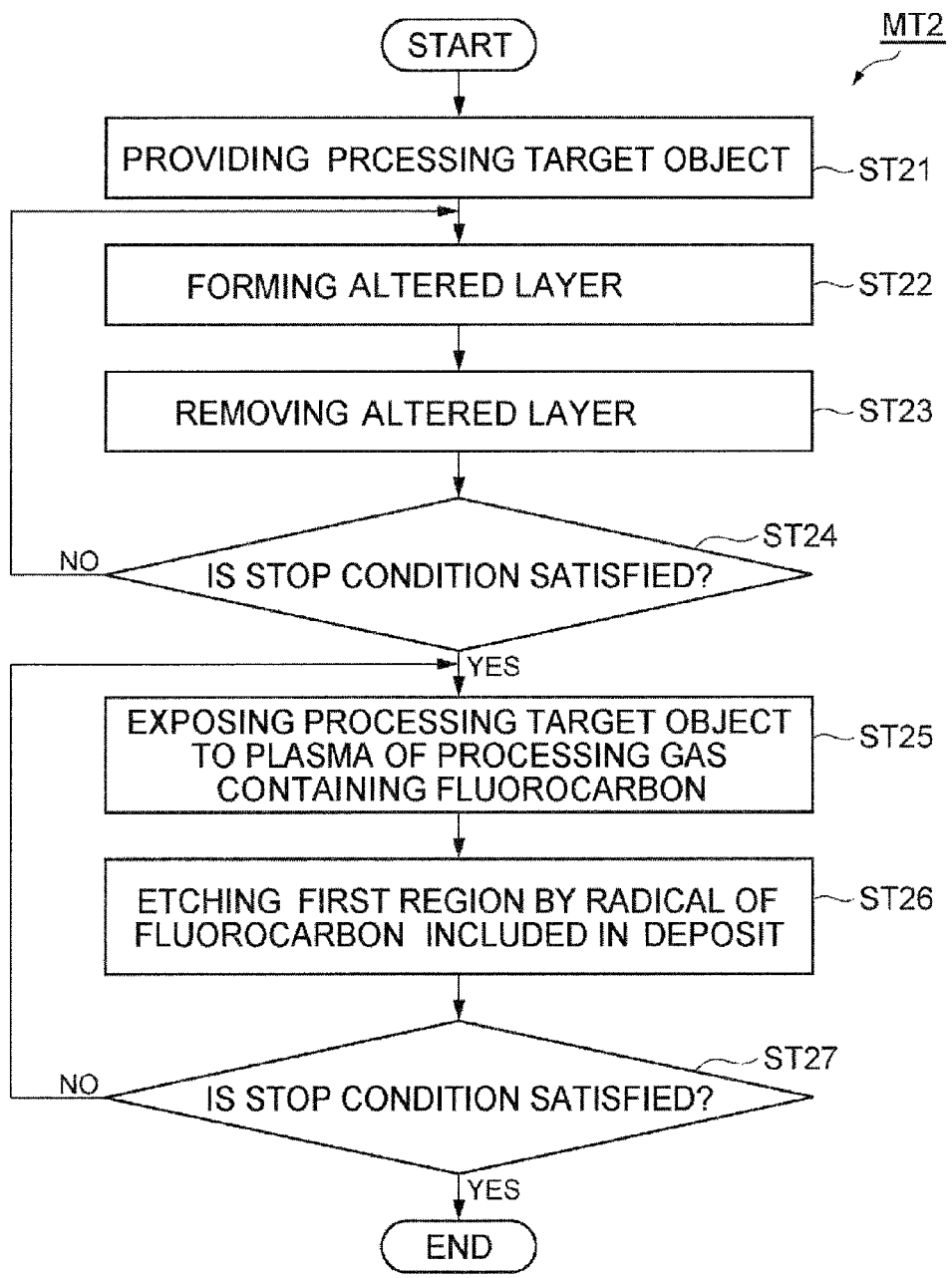
FIG. 8 is a flow chart illustrating an etching method according to a second exemplary embodiment.

Next, an etching method according to a second exemplary embodiment will be described. FIG. 8 is a flow chart illustrating an etching method according to a second exemplary embodiment. The method MT2 illustrated in FIG. 8 is a method of selectively etching a first region made of silicon oxide. In an example, the method MT2 may be used for forming a hole in a self-alignment manner in the above-described processing target object illustrated in FIG. 2. Further, the method MT2 may be performed using the above-described plasma processing apparatus 10. Hereinafter, descriptions will be made focusing on a difference from the first exemplary embodiment, and duplicate description will be omitted.

In the method MT2, step ST21, step ST22, step ST23, and step ST24 are performed first. Steps ST21, ST22, ST23, and ST24 are the same as steps ST1, ST2, ST3, and ST4 of the method MT1. In the method MT2, which steps ST21, ST22, ST23, and ST24 are performed, the wafer W, in which the first region 106 is partially removed and the second regions 104 are exposed as illustrated in FIG. 5B, can be obtained.

Subsequently, in the method MT2, step ST25 is performed. In step ST25, the wafer W is exposed to the plasma of a fourth gas containing fluorocarbon gas. In step ST25, the fourth gas is excited to generate the plasma, and the wafer W is exposed to the generated plasma.

When step ST25 is performed using the plasma processing apparatus 10, the fourth gas is supplied into the processing chamber 12 from the gas source group 40. Further, in step ST25, a high frequency power from the first high frequency power supply 62 is supplied to the lower electrode LE. In step ST25, a high frequency bias power from the second high frequency power supply 64 may be supplied to the lower electrode LE. Further, in step ST25, the pressure within the processing chamber 12 is set to be a predetermined pressure by the exhaust device 50. The pressure within the processing chamber 12 is set to be in a range of 20 mTorr (2.666 Pa) to 50 mTorr (6.666 Pa), for example. Further, in step ST25, the distance between the upper electrode 30 and the top surface of the placing table PD is set to be in a range of 20 mm to 50 mm. Thus, the plasma of the fluorocarbon gas is generated in the processing chamber 12, and the wafer W placed on the placing table PD is exposed to the plasma. Further, in step ST25, a negative DC voltage from the DC power supply 70 may be applied to the upper electrode 30. Further, an operation of each component of the plasma processing apparatus 10 in performing step ST25 may be controlled by the control unit Cnt.

Figure 9A:
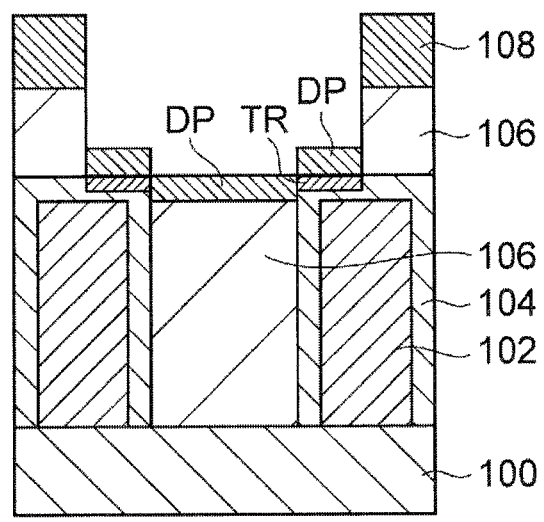
FIGS. 9A and 9B are cross sectional views illustrating a processing target object in a state where each step of the etching method according to the second exemplary embodiment has been performed.

In step ST25, at the initial stage thereof, active species of atoms and/or molecules which originate from fluorocarbon, for example, the active species of a fluorine and/or the fluorocarbon collide against the first region 106 illustrated in FIG. 5B. Thus, the first region 106 is etched in step ST25. Further, as illustrated in FIG. 9A, deposits containing the fluorocarbon are attached to the first region 106 in step ST25. Thus, the deposit DP containing the fluorocarbon is formed on the first region 106. The film thickness of the deposit DP is increased with the lapse of performing time of step ST25.

Further, in step ST25, at the initial stage thereof, active species of atoms and/or molecules which originates from fluorocarbon, for example, the active species of fluorine and/or fluorocarbon also collide against the second regions 104 illustrated in FIG. 5B. When the species collide against the second regions 104, a surface layer portion having a predetermined depth from the surface of the second regions 104 is modified to form a modified region TR as illustrated in FIG. 9A. The modified region TR includes silicon and nitrogen constituting the second regions 104, and atoms and/or molecules included in the fourth gas. The modified region TR may include, for example, carbon, fluorine, and oxygen included in the fourth gas, in addition to the silicon and nitrogen. Further, deposits DP are formed on the modified region TR in step ST25.

When the film thickness of the deposits DP formed by the processing of step ST25 is increased, an active species which is able to etch the first region 106 is suppressed being from reaching the first region 106 by the deposits DP. Therefore, when step ST25 is continuously performed, the etching of the first region 106 is stopped. In order to prevent stopping of the etching, step ST26 is subsequently performed in the method MT2.

In step ST26, the first region 106 is etched by the radicals of fluorocarbon which are included in the deposits DP. In step ST26 of an exemplary embodiment, the wafer W after performing step ST25 is exposed to the plasma of a rare gas. The processing time in step ST25 and the processing time in step ST26 may be arbitrarily set. In an exemplary embodiment, the ratio occupied by the processing time in step ST25 in the total of the processing time in step ST25 and the processing time in step ST26 may be set to be in a range of 30% to 70%.

When step ST26 is performed using the plasma processing apparatus 10, the rare gas is supplied from the gas source group 40. Further, in step ST26, oxygen gas (O2 gas) may be supplied in addition to the rare gas. Further, in step ST26, a high frequency power from the first high frequency power supply 62 is supplied to the lower electrode LE. Further, in step ST26, a high frequency bias power from the second high frequency power supply 64 may be supplied to the lower electrode LE. The pressure within the processing chamber 12 is be set to be in a range of 20 mTorr (2.666 Pa) to 50 mTorr (6.666 Pa), for example. Further, in step ST26, the distance between the upper electrode 30 and the top surface of the placing table PD is set to be in a range of 20 mm to 50 mm. Thus, plasma of the rare gas is generated in the processing chamber 12, and the wafer W placed on the placing table PD is exposed to the plasma. Further, in step ST26, a negative DC voltage from the DC power supply 70 may be applied to the upper electrode 30. Further, the operation of each component of the plasma processing apparatus 10 in performing step ST26 may be controlled by the control unit Cnt.

Figure 9B:
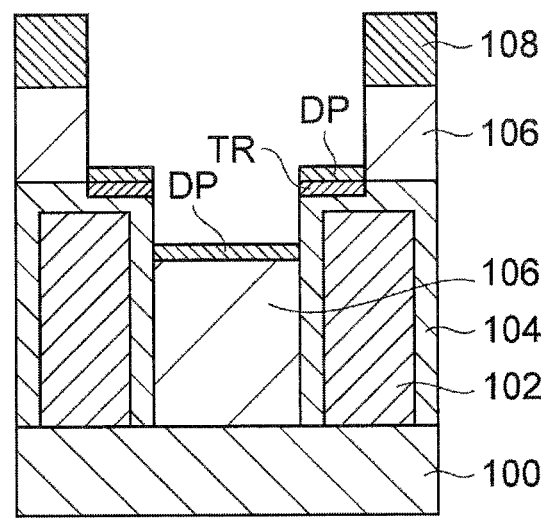

Further, in step ST26, active species of rare gas atoms, for example, ions of the rare gas atoms collide against the deposits DP. Thus, as illustrated in FIG. 9B, the radicals of fluorocarbon in the deposits DP cause the etching of the first region 106 to proceed. Further, the film thickness of the deposits DP decreases by step ST26. Further, in step ST26, the film thickness of the deposits DP on the second regions 104 decreases as illustrated in FIG. 9B. However, since the modified region TR exists on the second region 104, the etching of the second region 104 is suppressed.

In the method MT2, step ST25 is performed again after step ST26 is performed. Since the film thickness of the deposit DP is decreased by performing the previous process ST26, the first region 106 can be further etched when the wafer W is exposed to the plasma of the processing gas described above by performing step ST25 again. Thereafter, by further performing step ST26, the first region 106 can be etched by the radicals of fluorocarbon in the deposits DP.

In the method MT2, it is determined whether a stop condition is satisfied in step ST27. It is determined that the stop condition is satisfied, for example, when the number of repetition times of a cycle including steps ST25 and ST26 reaches a predetermined number of times. When the stop condition is not satisfied, the cycle including steps ST25 and ST26 is performed again. Meanwhile, when the stop condition is satisfied, the method MT2 is terminated. Although the etching of the first region 106 does not reach the base layer 100 in FIG. 9B, steps ST25 and ST26 may be performed until the etching of the first region 106 reaches the base layer 100. Further, after steps ST25 and ST26 are repeatedly performed until the etching of the first region 106 reaches the base layer 100, the residue 106b made of silicon oxide may be removed by further performing the steps which are the same as steps ST9 and ST10 of the method MT1.

In the method MT2 described above, steps ST25 and ST26 are alternately performed multiple times so that the etching stop of the first region 106 can be prevented. As a result, the etching of the first region 106 may be continuously performed. Further, in the method MT2, the first region 106 may be selectively etched with respect to the second regions 104.

Although several exemplary embodiments are described above, various modified embodiments may be implemented without being limited thereto. For example, in the exemplary embodiments described above, the plasma processing apparatus 10 is a capacitively coupled plasma processing apparatus, but another type of plasma processing apparatus may be used. Various plasma processing apparatuses such as, for example, an inductively coupled plasma processing apparatus and a plasma processing apparatus using a plasma source such as, for example, microwaves, may be used.

Further, steps ST5, ST6, ST8, ST9, and ST10 of the method MT1, and steps ST25 and ST26 of the method MT2 are optional steps which are suitable for forming the hole HL in the wafer W illustrated in FIG. 2. Therefore, the steps are considered as being unnecessary, depending on a wafer. For example, when a wafer includes a first region made of silicon oxide and a second region made of silicon nitride, a method including only steps ST2 and ST3 or including only steps ST22 and ST23 may be performed in order to etch the first region.

Further, in the exemplary embodiment described above, the first region of the wafer W which is illustrated in FIG. 2 is etched by the methods MT1 and MT2. However, the processing target object is not limited to the wafer W illustrated in FIG. 2. The methods MT1 and MT2 may be employed in any processing target object having a region made of silicon oxide.

Hereinafter, various test examples performed to evaluate steps ST2 and ST3 of the method MT1, and steps ST22 and ST23 of the method MT2 will be described. The test examples described below are represented merely for illustrative purpose, and are not intended to limit the present disclosure.

(Test Examples 1, 2 and Comparative Example 1)

In Test Examples 1 and 2 and Comparative Example 1, wafers were prepared by performing step ST2 on wafers W including the second regions 104 and the first region 106 illustrated in FIG. 2 under the processing conditions described below. In Test Examples 1 and 2, step ST3 were performed on the wafers under the processing conditions and thus, the altered layers were removed. Further, in Test Examples 1 and 2, steps ST2 and ST3 were performed seven times to expose the second regions 104. In Comparative Example 1, a heating processing was performed on the same wafers as Test Example 1 by a thermal processing chamber under the processing conditions below and thus, the altered layers were removed. Further, in Comparative Example 1, step ST2 and the heating processing were performed seven times and thus, the second regions 104 were exposed. Further, in Comparative Example 1, the heating processing is performed under a nitrogen atmosphere.

Figure 10:
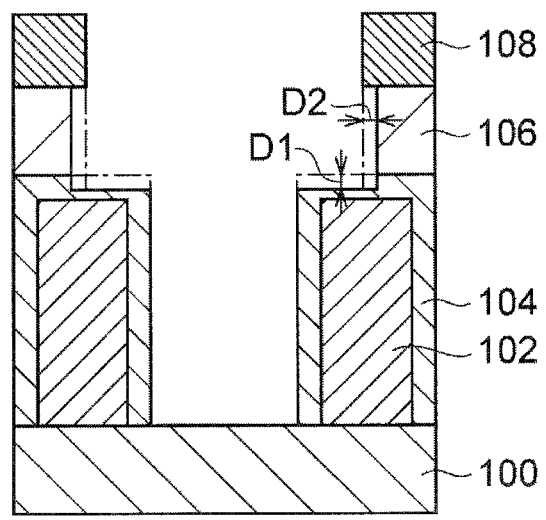
FIG. 10 is a view for describing an etching amount of a second region and a side etching amount of a first region.

<Processing Condition of Test Example 1>
Step ST2
  Pressure within processing chamber: 500 mTorr
  Flow rate of $NF_3$ gas: 120 sccm
  Flow rate of $H_2$ gas: 300 sccm
  Flow rate of $N_2$ gas: 300 sccm
  Flow rate of Ar gas: 1000 sccm
  High frequency power of first high frequency power supply 62:1000W
  High-frequency bias power of second high frequency power supply 64: 0 W
  Temperature of wafer: 0° C.
  Processing time: 45 seconds
Step ST3
  Pressure within processing chamber: 50 mTorr
  Flow rate of $N_2$ gas: 400 sccm
  High frequency power of first high frequency power supply 62:300 W
  High-frequency bias power of second high frequency power supply 64:0 W
  Temperature of wafer: 0° C.
  Processing time: 30 seconds
<Processing Condition of Test Example 2>
Step ST2
  Pressure within processing chamber: 500 mTorr
  Flow rate of $NF_3$ gas: 120 sccm
  Flow rate of $H_2$ gas: 300 sccm
  Flow rate of $N_2$ gas: 300 sccm
  Flow rate of Ar gas: 1000 sccm
  High frequency power of first high frequency power supply 62: 1000 W
  High-frequency bias power of second high frequency power supply 64: 0 W
  Temperature of wafer: 0° C.
  Processing time: 45 seconds
Step ST3
  Pressure within processing chamber: 50 mTorr
  Flow rate of $N_2$ gas: 400 sccm
  High frequency power of first high frequency power supply 62: 300 W
  High-frequency bias power of second high frequency power supply 64: 0 W
  Temperature of wafer: 0° C.
  Processing time: 30 seconds
<Processing Condition of Comparative Example 1>
Process ST2
  Pressure within processing chamber: 500 mTorr
  Flow rate of $NF_3$ gas: 120 sccm
  Flow rate of $H_2$ gas: 300 sccm
  Flow rate of $N_2$ gas: 300 sccm
  Flow rate of Ar gas: 1000 sccm
  High frequency power of first high frequency power supply 62: 1000 W
  High-frequency bias power of second high frequency power supply 64: 0 W
  Temperature of wafer: 0° C.
  Processing time: 45 seconds
Heating Processing
  Pressure within processing chamber: 5 Torr
  Temperature of wafer: 180° C.
  Processing time: 180 seconds With respect to the wafers W on which the above-described processings of Test Examples 1 and 2 and Comparative Example 1 were performed, a variation in film thickness of second regions 104 adjacent to the centers thereof in the width direction, that is, an etching amount D1 was measured (FIG. 10). Further, a variation in width of the first regions 106 located under the mask 108, that is, an amount of side etching D2 was measured (FIG. 10). As a result, the etching amounts of D1 the second regions 14 in Test Example 1 and Test Example 2 were 1.6 nm and 1.6 nm, respectively, and the side etching amounts D2 of the first region 106 in Test Example 1 and Test Example 2 were 4 nm and 1 nm, respectively. Meanwhile, in Comparative example 1, the etching amount D1 of the second region 104 was 1.6 nm, and the side etching amount D2 of the first region 106 was 13 nm.

When comparing the etching amounts D1 of the second regions 104 by the processings of Test Examples 1 and 2 and the etching amount D1 of the second regions 104 by the processing of Comparative Example 1, both etching amounts are substantially equal to each other. From this result, it has been found that the altered layers may be removed while suppressing the etching of a region made of silicon nitride according to step ST3 like the heating processing. Further, when comparing the side etching amounts D2 of the first region 106 by the processings of Test Examples 1 and 2 and the side etching amount D2 of the first region 106 by the processing of Comparative Example 1, the side etching amounts D2 of the first region 106 by the processings of Test Examples 1 and 2 were smaller than the side etching amount D2 of the first region 106 by the processing of Comparative Example 1. From this result, it has been found that the altered layer of the first region 106 may be removed with a higher anisotropy in step ST3 than the heating processing.

Further, when comparing the etching amount D1 of the second regions 104 by the processing of Test Example 1 and the etching amount D1 of the second regions 104 by the processing of Test Example 2, both etching amounts were substantially equal to each other. Meanwhile, when comparing the side etching amount D2 of the first region 106 by the processing of Test Example 1 and the side etching amount D2 of the first region 106 by the processing of Test Example 2, the side etching amount D2 of the first region 106 by the processing of Test Example 2 was smaller than the side etching amount D2 of the first region 106 by the processing of Test Example 1. From this result, it has been found that the altered layer of the first region 106 may be removed in Test Example 2 in which Ar gas was used as the processing gas in step ST3, with a higher anisotropy than Test Example 2 in which the N2 gas was used as the processing gas in step ST3.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method for selectively etching an oxidation layer made of silicon from a processing target object having the oxidation layer within a processing chamber of a plasma processing apparatus, the etching method comprising:
   forming an altered layer by generating a first plasma of a gas containing hydrogen, nitrogen, and fluorine to alter the oxidation layer; and
   after the forming the altered layer, irradiating secondary electrons to the processing target object to remove the altered layer within the processing chamber where a second plasma having positive ions is generated in the processing chamber and negative direct current voltage is applied on an upper electrode of the plasma processing apparatus so that the positive ions generated from the second plasma collide against the upper electrode, thereby emitting the secondary electrons from the upper electrode.

2. The method of claim 1, wherein, in the forming the altered layer, the first plasma of a gas containing $H_2$, $N_2$, and $NF_3$ or plasma of a gas containing $NH_3$ and $NF_3$ is generated.

3. The method of claim 1, wherein, in the removing the altered layer, the second plasma of an inert gas is generated within the processing chamber.

4. The method of claim 1, wherein the forming the altered layer and the removing the altered layer are repeated multiple times.

5. The method of claim 1, wherein the processing target object further includes a nitride layer made of silicon nitride, and
   wherein, after the removing the altered layer, the method further comprises:
   forming a protective film on the nitride layer which is thicker than a protective film formed on the oxidation layer, in which the processing target object is exposed to a third plasma of a fluorocarbon gas; and
   etching the oxidation layer, in which the processing target object is exposed to the third plasma of the fluorocarbon gas, and
   wherein a high frequency power supplied to a placing table configured to place the processing target object thereon in the forming the protective film is lower than a high frequency bias power supplied to the placing table in the etching the oxidation layer, and
   in the forming the protective film, a temperature of the processing target object is set to be equal to or higher than 60° C. and equal to or lower than 250° C.

6. The method of claim 5, wherein, in the forming the protective film, a high frequency bias power is not supplied to the placing table.

7. The method of claim 5, wherein the nitride layer is covered with the oxidation layer, and
   the forming the protective film and the etching the oxidation layer are performed after the nitride layer is appeared from the oxidation layer by the forming the altered layer and the removing the altered layer.

8. The method of claim 5, wherein, in the forming the protective film, a gas containing at least one of $C_4F_6$, $C_4F_8$, and $C_6F_6$ is used as the fluorocarbon gas.

9. The method of claim 5, wherein the forming the protective film and the etching the oxidation layer are alternately repeated.

10. The method of claim 1, wherein, after the removing the altered layer, the method further comprises:
    exposing the processing target object to a third plasma of a processing gas including a fluorocarbon gas, in which a deposition film including a fluorocarbon is formed on the oxidation layer; and
    etching the oxidation layer by a radical of the fluorocarbon included in the deposition film,
    wherein the exposing the processing target object to the third plasma of the processing gas including the fluorocarbon gas and the etching the oxidation layer by the radical of the fluorocarbon are alternately repeated.

11. The method of claim 10, wherein, in the etching the oxidation layer by the radical of the fluorocarbon, the processing target object is exposed to the third plasma, and wherein the third plasma includes a rare gas.

12. The method of claim 11, wherein, in the etching the oxidation layer by the radical of the fluorocarbon, the fluorocarbon gas is not supplied.

13. The method of claim 10, wherein the processing target object further includes a nitride layer made of silicon nitride and the nitride layer is covered with the oxidation layer, and
the exposing the processing target object to the third plasma of the processing gas and the etching the oxidation layer by the radical of the fluorocarbon is performed after the nitride layer is appeared from the oxidation layer by the forming the altered layer and the removing the altered layer.

\* \* \* \* \*